(12) United States Patent
Hayashi et al.

(10) Patent No.: US 9,776,380 B2
(45) Date of Patent: *Oct. 3, 2017

(54) CERAMIC MEMBER (75) Inventors: Shintaro Hayashi, Tokyo (JP);
Masayuki Ishizuka, Tokyo (JP);
Kazuto Ando, Tokyo (JP)

(73) Assignee: SUMITOMO OSAKA CEMENT CO., LTD. (JP)

( * ) Notice: Subject to any disclaimer, the term of this patent is extended or adjusted under 35 U.S.C. 154(b) by 10 days.

This patent is subject to a terminal disclaimer.

(21) Appl. No.: 13/876,466

(22) PCT Filed: Sep. 26, 2011

(86) PCT No.: PCT/JP2011/071822
§ 371 (c)(1),
(2), (4) Date: Mar. 27, 2013

(87) PCT Pub. No.: WO2012/043441
PCT Pub. Date: Apr. 5, 2012

(65) Prior Publication Data
US 2013/0183503 A1    Jul. 18, 2013

(30) Foreign Application Priority Data
Sep. 29, 2010    (JP) ................................. 2010-218657

(51) Int. Cl.
*B32B 18/00* (2006.01)
*H01B 1/14* (2006.01)
(Continued)

(52) U.S. Cl.
CPC ............... *B32B 18/00* (2013.01); *B32B 7/02* (2013.01); *B82Y 30/00* (2013.01); *C04B 35/505* (2013.01);
(Continued)

(58) Field of Classification Search
None
See application file for complete search history.

(56) References Cited

U.S. PATENT DOCUMENTS 3,278,571 A * 10/1966 Mazdiyasni ............ C07C 29/68
534/15
4,861,410 A * 8/1989 Clark .................... C04B 35/803
156/325
(Continued)

FOREIGN PATENT DOCUMENTS

JP    A-2005-206412    8/2005
JP    A-2007-246319    9/2007
(Continued)

OTHER PUBLICATIONS

Machine translation of JP 2009/184881 A. Obtained from Industrial Property Digital Library of the JPO on Aug. 23, 2015.*
(Continued)

*Primary Examiner* — Aaron Austin
*Assistant Examiner* — Zheren J Yang
(74) *Attorney, Agent, or Firm* — Merchant & Gould P.C.

(57) ABSTRACT

Provided is a ceramic member in which the difference in thermal expansion coefficient between an insulating ceramic material and an electrically conductive ceramic material is extremely small and therefore any mismatch caused in association with this difference in thermal expansion coefficient does not occur, and which does not undergo any failure such as breakage, cracking, detachment or destruction. The ceramic member (1) includes an electrically conductive ceramic material (2) which contains yttrium oxide as the main component and additionally contains a fibrous electrically conductive substance such as carbon nanotubes in an amount of 0.1 to 3 vol % inclusive and an insulation ceramic material (3) which contains yttrium oxide as the main component, wherein the electrically conductive (Continued)

ceramic material (2) and the insulation ceramic material (3) are adhered to each other in an integrated manner through an adhesive layer (4) which includes an inorganic adhesive material.

13 Claims, 1 Drawing Sheet

(51) Int. Cl.
| | |
|---|---|
| *H01B 1/18* | (2006.01) |
| *H01B 1/08* | (2006.01) |
| *B82Y 30/00* | (2011.01) |
| *C04B 35/505* | (2006.01) |
| *C04B 35/626* | (2006.01) |
| *C04B 37/00* | (2006.01) |
| *C23C 16/44* | (2006.01) |
| *B32B 7/02* | (2006.01) |
| *C04B 35/634* | (2006.01) |
| *C04B 35/645* | (2006.01) |

(52) U.S. Cl.
CPC .... *C04B 35/6264* (2013.01); *C04B 35/63452* (2013.01); *C04B 35/645* (2013.01); *C04B 37/001* (2013.01); *C04B 37/005* (2013.01); *C04B 37/008* (2013.01); *C23C 16/44* (2013.01); *H01B 1/08* (2013.01); *H01B 1/14* (2013.01); *H01B 1/18* (2013.01); *C04B 2235/3826* (2013.01); *C04B 2235/526* (2013.01); *C04B 2235/5264* (2013.01); *C04B 2235/5288* (2013.01); *C04B 2235/5296* (2013.01); *C04B 2235/658* (2013.01); *C04B 2235/6567* (2013.01); *C04B 2235/77* (2013.01); *C04B 2235/9607* (2013.01); *C04B 2235/9692* (2013.01); *C04B 2237/04* (2013.01); *C04B 2237/062* (2013.01); *C04B 2237/34* (2013.01); *C04B 2237/38* (2013.01); *C04B 2237/584* (2013.01); *C04B 2237/704* (2013.01); *Y10T 428/24942* (2015.01); *Y10T 428/249928* (2015.04)

(56) References Cited

U.S. PATENT DOCUMENTS

| | | | | |
|---|---|---|---|---|
| 5,130,055 A * | 7/1992 | Yasutomi | ................ | B32B 18/00 252/516 |
| 5,521,150 A * | 5/1996 | Murakami | .......... | C04B 35/4508 228/198 |
| 5,534,091 A * | 7/1996 | Okuda | ................. | C04B 37/001 156/272.2 |
| 5,883,360 A * | 3/1999 | Tatematsu | ............... | F23Q 7/001 219/267 |
| 6,447,937 B1 * | 9/2002 | Murakawa | .............. | C04B 35/18 428/446 |
| 6,610,964 B2 * | 8/2003 | Radmacher | ............. | F23Q 7/001 123/145 A |
| 6,824,897 B2 * | 11/2004 | Noda | .......................... | C09J 5/06 156/89.11 |
| 6,884,967 B1 * | 4/2005 | Leigh | ........................... | 219/270 |
| 7,211,153 B2 * | 5/2007 | Kuibira | ................... | B32B 18/00 118/725 |
| 9,403,722 B2 | 8/2016 | Ando et al. | | |
| 2001/0005562 A1 * | 6/2001 | Yoshioka et al. | ............. | 429/185 |
| 2002/0081445 A1 * | 6/2002 | Kadomura | .............. | B32B 18/00 428/469 |
| 2003/0207155 A1 * | 11/2003 | Morrison | ................ | B32B 18/00 428/699 |
| 2004/0150140 A1 * | 8/2004 | Zhan | ...................... | B82Y 30/00 264/430 |
| 2005/0014628 A1 * | 1/2005 | Yoshikawa | ............ | B82Y 30/00 501/95.2 |
| 2006/0073349 A1 * | 4/2006 | Aihara | ................... | C04B 35/117 428/469 |
| 2008/0116187 A1 * | 5/2008 | Sugimoto | ......... | H01L 21/67103 219/200 |
| 2008/0145672 A1 * | 6/2008 | Willkens | ................. | B28B 1/008 428/426 |
| 2008/0174930 A1 * | 7/2008 | Hattori | ................... | B29C 43/006 361/234 |
| 2008/0268323 A1 * | 10/2008 | Tucker | .................. | C04B 35/016 429/402 |
| 2009/0002913 A1 * | 1/2009 | Naim | ................ | H01L 21/67109 361/234 |
| 2009/0200523 A1 * | 8/2009 | Kobayashi | ............ | C04B 35/505 252/516 |
| 2010/0044584 A1 * | 2/2010 | Cooper | ................... | B82Y 30/00 250/459.1 |
| 2010/0282459 A1 * | 11/2010 | Leonhardt | ............... | C04B 41/51 165/185 |
| 2012/0146023 A1 * | 6/2012 | Craft | ..................... | C04B 35/581 257/51 |

FOREIGN PATENT DOCUMENTS

| | | |
|---|---|---|
| JP | A-2008-130609 | 6/2008 |
| JP | 2009/184881 A * | 8/2009 |
| JP | A-2009-184881 | 8/2009 |
| WO | WO 2013/062239 A1 * | 5/2013 |

OTHER PUBLICATIONS

Machine translation of WO 2013/062239 A1, obtained using Google Patent service on Apr. 3, 2017.*
International Search Report for corresponding International Patent Application No. PCT/JP2011/071822 (dated Dec. 20, 2011).
Characteristic of Kyocera Fine Ceramics, 4 pp. (Aug. 2016), available at http://global.kyocera.com/prdct/fc/product/pdf/material.pdf.

* cited by examiner

CERAMIC MEMBER

This application is a U.S. National Stage Application under 35 U.S.C. §371 of International Patent Application No. PCT/JP2011/071822 filed 26 Sep. 2011, which claims the benefit of priority to Japanese Patent Application No. 2010-218657 filed 29 Sep. 2010, the disclosures of all of which are hereby incorporated by reference in their entireties. The International Application was published in Japanese on 5 Apr. 2012 as WO 2012/043441.

TECHNICAL FIELD

The present invention relates to a ceramic member, and more specifically to a ceramic member preferably used in an etching apparatus using plasma, a CVD apparatus, an ashing apparatus, and the like.

BACKGROUND

In the past, in a semiconductor-manufacturing apparatus used in an etching process in which a plasma process forms the mainstream, a CVD film-forming process, and an ashing process which removes a resist among semiconductor-manufacturing processes, members were exposed to halogen-based corrosive gas, such as highly reactive fluorine or chlorine. Therefore, as a material of the members, ceramic materials which are materials having excellent corrosion resistance with respect to plasma or corrosive halogen gas are used.

In addition, the members are members which need to be conductive like a plasma focus ring having a function of focusing plasma on a wafer surface, a showerhead electrode having a role of an electrode, and the like, and are also members which need to be insulating like a chamber wall which allows high frequency penetration, a pedestal which holds wafers, a clamp ring which holds focus rings and wafers, a jig which fixes electrode, and the like. Therefore, depending on use, both insulating ceramics and conductive ceramics are used.

As the insulating ceramics, oxide ceramics, such as aluminum oxide ($Al_2O_3$) and yttrium oxide ($Y_2O_3$), are used. In addition, as the conductive ceramics, ceramics which are a single body and develop conductivity, such as silicon carbide (SiC), and combined ceramics that are combined by adding a conductive material, such as silicon carbide (SiC), carbon (C) or metal, to an insulating ceramic are used.

As the combined ceramics, for example, conductive ceramics obtained by adding a conductive material, such as metal yttrium, carbon, yttrium nitride or yttrium carbide, to yttrium oxide ($Y_2O_3$), which is an insulating ceramic, are proposed (Patent Document 1).

In addition, among semiconductor-manufacturing apparatuses, in an etching apparatus using plasma, a CVD apparatus, an ashing apparatus, and the like, ceramic members obtained by combining and integrating an insulating ceramic and a conductive ceramic are used.

These ceramic members are obtained by working an insulating ceramic and a conductive ceramic into predetermined shapes respectively, and adhering both ceramics using an adhesive or mechanically joining both ceramics using clamps, screws, bolts, or the like. In a case in which an adhesive is used, an organic-based adhesive, such as epoxy, cannot be used due to its corrosion resistance and heat resistance, and therefore an inorganic-based adhesive is used. In this case, the thermal expansion coefficient of the adhesive is matched to any of the insulating ceramic and the conductive ceramic.

CITATION LIST

Patent Literature

[PTL 1] Japanese Unexamined Patent Application Publication No. 2005-206412

SUMMARY OF INVENTION

Technical Problem

However, in a case in which a ceramic member of the related art, which is integrated by adhering an insulating ceramic and a conductive ceramic using an adhesive, is applied to an etching apparatus in which plasma is used, when the ceramic member reaches a high temperature due to plasma, since the insulating ceramic and the conductive ceramic have different thermal expansion coefficients, the insulating ceramic and the conductive ceramic are mismatched due to the difference in thermal expansion coefficients between the ceramics, and there was a problem in that the mismatch causes breakage or cracking in the adhesive layer. Particularly, when the shape of the ceramic member becomes large, this tendency becomes significant.

In addition, in a case in which the ceramics are adhered using an inorganic-based adhesive, it is not possible to match the thermal expansion coefficient of the adhesive to those of both the insulating ceramic and the conductive ceramic, and therefore there was a problem in that there is a concern that detachment may occur in the interface between the adhesive and the ceramic having a thermal expansion coefficient which is not matched to that of the adhesive.

In addition, even in a case in which the ceramics are mechanically joined, similarly, a stress caused by the thermal expansion mismatch is applied to the ceramic member, and therefore there was a problem in that the ceramic member may be broken.

As a method for solving the thermal expansion mismatch, there is a method in which a buffer layer is sandwiched between the insulating ceramic and the conductive ceramic, and, in this case, since thermal conduction between the ceramics is inhibited due to the buffer layer, heat is accumulated in the interface between the ceramics, consequently, plasma becomes uneven, and there is a concern that a problem of a decrease in the yield in a semiconductor-manufacturing process may be caused. In addition, there is another method in which a gap is provided in a design step in consideration of the difference in thermal expansion between the insulating ceramic and the conductive ceramic, but there is a concern for a problem that the thermal conduction inhibition between the ceramics as the result of the gap may be caused.

In addition, in a conductive ceramic of the related art in which yttrium oxide is used, in a case in which metal yttrium is added to yttrium oxide, since the thermal expansion coefficient of metal yttrium is extremely larger than the thermal expansion coefficient of yttrium oxide, the thermal expansion coefficient of the conductive ceramic significantly changes. Therefore, it is not possible to solve the thermal expansion mismatch.

In addition, in a case in which yttrium nitride, yttrium carbide, carbon or the like is added to yttrium oxide, in order to sufficiently develop conductivity, it is necessary to add the additive in 5 volume % or more; however, when the additive is added in 5 volume % or more, the thermal expansion coefficient of the conductive ceramic changes significantly. Therefore, it is not possible to solve the thermal expansion mismatch.

The invention has been made in consideration of the above circumstances, and an object of the invention is to provide a ceramic member in which there is an extremely minor difference in thermal expansion coefficients between an insulating ceramic and a conductive ceramic, and therefore there is no concern that a mismatch may be caused due to the difference in thermal expansion between the insulating ceramic and the conductive ceramic, and there is no concern that a disadvantage, such as breakage, cracking, detachment or destruction, may be caused.

Solution to Problem

As a result of intensive studies for solving the above problems, the present inventors found that, when a conductive ceramic including yttrium oxide as a main component and containing 0.1 volume % to 3 volume % of a fibrous conductive substance and an insulating ceramic including yttrium oxide as a main component are adhered or joined, the difference in thermal expansion coefficient between the insulating ceramic and the conductive ceramic is extremely small, and therefore there is no concern that a mismatch may be caused due to the difference in thermal expansion between the insulating ceramic and the conductive ceramic, and there is no concern that a disadvantage, such as cracking, detachment or breakage, may be caused, and completed the invention.

That is, in the ceramic member of the invention, the conductive ceramic including yttrium oxide as a main component and containing 0.1 volume % to 3 volume % of a fibrous conductive substance and the insulating ceramic including yttrium oxide as a main component are adhered or joined.

The fibrous conductive substance is preferably a nanofiber having an aspect ratio of 10 or more.

The nanofiber is preferably a carbon nanotube.

The conductive ceramic and the insulating ceramic are preferably adhered through an adhesive layer made of an inorganic adhesive material.

The thermal expansion coefficients of the conductive ceramic and the insulating ceramic and the thermal expansion coefficient of the adhesive layer are preferably substantially matched.

The conductive ceramic and the insulating ceramic may be joined through heating.

Advantageous Effects of Invention

According to the ceramic member of the invention, since the conductive ceramic including yttrium oxide as a main component and containing 0.1 volume % to 3 volume % of a fibrous conductive substance and the insulating ceramic including yttrium oxide as a main component are adhered or joined, it is possible to make the difference between the thermal expansion coefficient of the insulating ceramic and the thermal expansion coefficient of the conductive ceramic extremely small, and therefore it is possible to eliminate the mismatch caused by the difference in thermal expansion between the insulating ceramic and the conductive ceramic.

Thereby, it is possible to provide a ceramic member which is excellent in terms of corrosion resistance with respect to plasma or corrosive halogen gas, and in which there is no concern that a disadvantage, such as breakage, cracking, detachment or destruction, may be caused.

In addition, since there is no concern that a disadvantage, such as breakage, cracking, detachment or destruction, may be caused, in a case in which this ceramic member is applied to a semiconductor-manufacturing apparatus, it is possible to eliminate contamination in wafers and the like.

DESCRIPTION OF EMBODIMENTS

Embodiments for carrying out the ceramic member of the invention will be described.

Meanwhile, the following embodiments are specific descriptions for better understanding of the purport of the invention, and do not limit the invention unless particularly otherwise described.

First Embodiment

Figure 1:
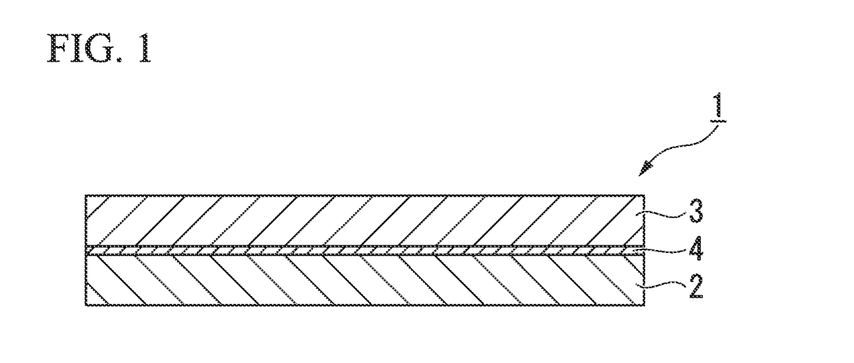
FIG. 1 is a cross-sectional view showing a ceramic member according to a first embodiment of the invention.

FIG. 1 is a cross-sectional view showing a ceramic member according to a first embodiment of the invention, and, in the drawing, 1 represents a ceramic member which is integrated by adhering a conductive ceramic 2 and an insulating ceramic 3 using an adhesive layer 4.

The conductive ceramic 2 is a ceramic including yttrium oxide as a main component and containing 0.1 volume % to 3 volume % of a fibrous conductive substance, and has a relative density of 95% or more and a volume resistivity value of 0.5 Ω·cm to 10 Ω·cm.

In the conductive ceramic 2, yttrium oxide ($Y_2O_3$) particles which are highly corrosion-resistant with respect to halogen-based plasma configure the matrix.

The average particle diameter of the yttrium oxide particles is preferably 0.1 µm to 10 µm, and more preferably 0.5 µm to 5 µm.

Here, the reason for limiting the average particle diameter of yttrium oxide particles to 0.1 µm to 10 µm is that, when the average particle diameter is less than 0.1 µm, since the total number of grain boundaries of yttrium oxide in the conductive ceramic increases, it is necessary to increase the addition amount of the fibrous conductive substance in order to develop conductivity, but an increase in the addition amount of the fibrous conductive substance decreases the corrosion resistance, which is not preferable. On the other hand, when the average particle diameter exceeds 10 µm, since the addition amount of the fibrous conductive substance decreases, the conductivity improves, but the total number of grain boundaries of yttrium oxide in the conductive ceramic decreases, and therefore the fibrous conductive substance is locally present (partially present), the conductivity is not become uniform in the conductive ceramic, and, in a case in which the ceramic member is applied to a vacuum process apparatus, there is a concern that abnormal discharge and the like may be caused, which is not preferable.

In the conductive ceramic 2, the fibrous conductive substance is three-dimensionally dispersed. Here, the "three-dimensionally dispersed fibrous conductive substance" means that the fibrous conductive substance is randomly disposed without showing a specific orientation and is dispersed between yttrium oxide particles (in the grain boundaries). That is, in a case in which a certain volume is picked from the conductive ceramic 2, and the average value of the respective fibrous conductive substances included in the volume in the longitudinal direction is obtained, the average value becomes zero.

The fibrous conductive substance is preferably a substance which is not fused, lost and changed in an operation atmosphere or temperature area, and, in particular, in order to develop conductivity by adding an extremely small amount, the aspect ratio (length/diameter) needs to be 10 or more.

Examples of the nanofiber include carbon nanofiber and metal nanofiber, and, among the above, carbon nanofiber is preferable. The carbon nanofiber is preferably a carbon nanotube.

As the carbon nanotube, one or two or more selected from a group consisting of a Single Walled Carbon Nanotube (SWCNT), a Double Walled Carbon Nanotube (DWCNT) and a Multi Walled Carbon Nanotube (MWCNT) having an aspect ratio (length/diameter) of 10 or more, for example, having a diameter of 30 nm or less and a length of 10 μm or less are used.

Due to the anisotropic shape, the fibrous conductive substance is randomly present between yttrium oxide particles (in grain boundaries), and therefore the fibrous conductive substances come in contact with each other at some parts so as to form a network three-dimensionally so that conductive paths are formed in the grain boundaries in the conductive ceramic 2.

Therefore, when the fibrous conductive substance is added in an extremely small amount of 0.1 volume % to 3 volume %, it is possible to develop a conductivity of approximately 1 Ω·cm to 100 Ω·cm in the conductive ceramic 2, and the thermal expansion coefficient rarely changes.

Meanwhile, the fibrous conductive substance does not need to be present all between the yttrium oxide particles (in the grain boundaries), and there may be grain boundaries in which the fibrous conductive substance is not present.

The fibrous conductive substance is present as a single body or an aggregate in which a plurality of single bodies of the fibrous conductive substance is aggregated in the matrix made of yttrium oxide particles, and the aggregation diameter of the aggregate (the diameter of the aggregate) is 5 μm or less, and preferably 2 μm or less.

Here, when the aggregation diameter exceeds 5 μm, the fibrous conductive substance becomes liable to be lost due to halogen-based plasma, the corrosion resistance degrades, and a decrease in the conductivity and generation of particles are caused, which is not preferable. Particularly, when the ceramic member is used as a member for a semiconductor-manufacturing apparatus, some of the aggregate is selectively wasted due to plasma, consequently, degradation of the corrosion resistance, degradation of the conductivity, and generation of particles are caused, which makes the ceramic member unsuitable as a member for a semiconductor-manufacturing apparatus, in addition, the aggregate inhibits sintering such that the density of the conductive ceramic 2 does not improve during low-pressure sintering, and the volume resistivity does not sufficiently decrease. Furthermore, the conductive paths are not easily formed, and, in order to develop conductivity necessary for the conductive ceramic 2, it is necessary to increase the content of the fibrous conductive substance.

The content rate of the fibrous conductive substance is preferably 0.1 volume % to 3 volume %, and more preferably 0.5 volume % to 2 volume %.

Here, when the content rate of the fibrous conductive substance is smaller than 0.1 volume %, the conductive paths are not sufficiently formed such that it is not possible to develop conductivity necessary for the conductive ceramic 2. On the other hand, when the content rate of the fibrous conductive substance exceeds 3 volume %, the fibrous conductive substance is liable to form a coarse aggregate which is larger than 10 μm, and the corrosion resistance degrades.

The conductive ceramic 2 becomes dense so that the relative density, that is, the percentage of the ratio ($d_0/d_t$) of the real density ($d_0$) with respect to the theoretical density ($d_t$) is 95% or more.

In addition, the volume resistivity value of the conductive ceramic 2 is 0.5 Ω·cm to 10 Ω·cm.

Here, in order to set the volume resistivity value of the conductive ceramic 2 to less than 0.5 Ω·cm, it is necessary to increase the content rate of the fibrous conductive substance; however, when the content rate is increased, the fibrous conductive substance becomes liable to aggregate, and the corrosion resistance degrades, which is not preferable. In addition, it is not economic in terms of the costs to increase the content rate of the fibrous conductive substance. On the other hand, when the volume resistivity value exceeds 10 Ω·cm, in a case in which the ceramic member is used in a variety of vacuum process apparatuses under a variety of conditions, it is difficult to obtain electrical matching with simultaneously used members for the vacuum process apparatuses, and limitations on design are caused, which is not preferable.

The conductive ceramic 2 is excellent in terms of corrosion resistance with respect to halogen-based corrosive gas and plasma thereof and thermal conductivity, and is also excellent in terms of conductivity so that the volume resistivity value is 10 Ω·cm or less.

The conductive ceramic 2 develop conductivity when the fibrous conductive substance is added to the insulating ceramic including yttrium oxide as a main component in an extremely small amount of 0.1 volume % to 3 volume %, and, compared to insulating ceramics including yttrium oxide as a main component, properties other than conductivity, for example, thermal expansion coefficient, plasma corrosion resistance, and the like are not changed.

In addition, the insulating ceramic 3 is a ceramic including yttrium oxide as a main component, and is configured of yttrium oxide ($Y_2O_3$) particles which have particularly high corrosion resistance with respect to halogen-based plasma.

Since the yttrium oxide particles are the same as the yttrium oxide particles used in the conductive ceramic 2, description thereof will not be repeated.

Similarly to the conductive ceramic 2, the insulating ceramic 3 also becomes dense so that the relative density, that is, the percentage of the ratio ($d_0/d_t$) of the real density ($d_0$) with respect to the theoretical density ($d_t$) is 95% or more.

In addition, the volume intrinsic resistance value of the insulating ceramic 3 is $10^8$ Ω·cm or more, and the insulating ceramic is extremely excellent in terms of insulating properties.

The adhesive layer 4 is to adhere and thus integrate the conductive ceramic 2 and the insulating ceramic 3, and the thermal expansion coefficient thereof substantially matches the thermal expansion coefficients of the conductive ceramic 2 and the insulating ceramic 3.

As the adhesive layer 4, an inorganic-based adhesive material having a sufficient resistance even in, for example, a high-temperature atmosphere of 1000° C. or higher is preferably used, and examples of the inorganic-based adhesive material include alkali metal silicate-based adhesive materials, silica sol-based adhesive materials, and metal alkoxide-based adhesive materials.

In the ceramic member 1, the thermal expansion coefficients of the conductive ceramic 2 and the insulating ceramic 3 and the thermal expansion coefficient of the adhesive layer 4 substantially match.

Here, the substantial match of the thermal expansion coefficients means that the thermal expansion coefficients of the conductive ceramic 2 and the insulating ceramic 3 and the thermal expansion coefficient of the adhesive layer 4 match in a range of ±10%.

For example, in a case in which the thermal expansion coefficient of the insulating ceramic 3 made of yttrium oxide is $8 \times 10^{-6}$/° C., and the thermal expansion coefficient of the conductive ceramic 2 made of yttrium oxide containing 1 volume % of a single walled carbon nanotube (SWCNT) is $7.9 \times 10^{-6}$/° C., the thermal expansion coefficient of the adhesive layer 4 becomes $8 \times 10^{-6}$/° C.

As such, in the ceramic member 1 integrated by adhering the conductive ceramic 2 and the insulating ceramic 3 using the adhesive layer 4, there is no mismatch due to the difference in thermal expansion between the conductive ceramic 2 and the insulating ceramic 3 and the adhesive layer 4, the ceramic member is not broken even at a high temperature, and has a resistance with respect to use at 1000° C. or higher due to the material qualities of the adhesive layer 4.

Next, a method of manufacturing the ceramic member 1 will be described.

First, the conductive ceramic 2 and the insulating ceramic 3 are manufactured.

The conductive ceramic 2 can be manufactured by mixing a yttrium oxide slurry and a fibrous conductive substance slurry so as to produce a mixed slurry, subsequently, spraying and drying the mixed slurry so as to granulate the mixed slurry, molding the obtained granulated powder using a mold so as to produce a compact having a desired shape, and sintering the compact in an inert atmosphere.

Here, the yttrium oxide slurry in which yttrium oxide particles are evenly dispersed in a dispersion medium and the fibrous conducive substance slurry in which the fibrous conductive substance is evenly dispersed in a dispersion medium are separately prepared in advance.

In order to prepare the yttrium oxide slurry, yttrium oxide particles are added to a dispersion medium so that the content rate thereof becomes 30 mass % to 50 mass %, and then mixed.

Here, the reason for setting the content rate of the yttrium oxide particles to 30 mass % to 50 mass % is to prevent an increase in the viscosity of the mixed slurry when the yttrium oxide slurry and the fibrous conductive substance slurry are mixed so as to prepare the mixed slurry.

In addition, in order to prepare the fibrous conductive substance slurry, the fibrous conductive substance (solid content) is added to a dispersion medium so that the content rate thereof becomes 0.5 mass % to 2 mass %, and a dispersion treatment is carried out on a mixture including the fibrous conductive substance and the dispersion medium.

Here, the reason for setting the content rate of the fibrous conductive substance in the fibrous conductive substance slurry to 0.5 mass % to 2 mass % is that, when the content rate of the fibrous conductive substance exceeds 2 mass %, there are problems in that not only is there a concern that the fibrous conductive substance may be aggregated again, but also the fibrous conductive substance slurry becomes more viscous, deflocculation and dispersion of the fibrous conductive substance aggregate becomes difficult, and, furthermore, in a case in which the fibrous conductive substance slurry is mixed with the yttrium oxide slurry, an evenly mixed slurry cannot be obtained.

Meanwhile, there is no particular problem as long as the content rate of the fibrous conductive substance in the fibrous conductive substance slurry is 2 mass % or less; however, when the content rate of the fibrous conductive substance is decreased more than necessary, there are problems in that the absolute amount of the fibrous conductive substance in the slurry decreases, the amount of the solvent becomes excessive, and the inefficiency in manufacturing and an increase in the costs are caused. Therefore, the lower limit value of the content rate of the fibrous conductive substance is preferably 0.5 mass %.

The average secondary particle diameter of the fibrous conductive substance in the fibrous conductive substance slurry is preferably 2 µm or less.

When the average secondary particle diameter of the fibrous conductive substance exceeds 2 µm, the fibrous conductive substance is aggregated when mixed and dried with the yttrium oxide slurry, the aggregate of the fibrous conductive substance in a sintered body obtained when the subsequent sintering of the mixed slurry becomes coarse, and the corrosion resistance degrades, which is not preferable.

Setting the average secondary particle diameter of the fibrous conductive substance in the fibrous conductive substance slurry to 2 µm or less can suppress re-aggregation of the fibrous conductive substance in the mixed slurry and during drying when the fibrous conductive substance is mixed with the yttrium oxide slurry. As a result, the fibrous conductive substance does not form a coarse aggregate in a sintered body, is three-dimensionally dispersed in the grain boundaries of the yttrium oxide particles, and can efficiently form the conductive paths.

As the dispersion medium used in the yttrium oxide slurry and the fibrous conductive substance slurry, water and organic solvents can be used. Examples of the organic solvents that can be preferably used include monovalent alcohols, such as methanol, ethanol, 2-propanol, butanol and octanol, and denatured bodies thereof; alcohols belonging to monocyclic monoterpene, such as α-terpineol; carbitols, such as butyl carbitol; esters, such as ethyl acetate, butyl acetate, ethyl lactate, propylene glycol monomethyl ether acetate, propylene glycol monoethyl ether acetate, butyl carbitol acetate and γ-butyrolactone; ethers, such as diethyl ether, ethylene glycol monomethyl ether (methyl cellosolve), ethylene glycol monoethyl ether (ethyl cellosolve), ethylene glycol monobutyl ether (butyl cellosolve), diethylene glycol monomethyl ether and diethylene glycol monoethyl ether; ketones, such as acetone, methyl ethyl ketone, methyl isobutyl ketone, acetyl acetone and cyclohexanone; aromatic hydrocarbons, such as benzene, toluene, xylene and ethyl benzene; amides, such as dimethyl formamide, N,N-dimethyl acetamide and N-methylpyrrolidone, and one or two or more of the above solvents can be used.

A dispersant or a binder may be added when the slurries are prepared.

Examples of the dispersant or the binder that can be used include polycarboxylates, such as polycarboxylate ammonium salts; organic macromolecules, such as polyethylene glycol, polyvinyl alcohol, polyvinyl pyrrolidone; and the like.

As the dispersion treatment, first, it is necessary to carry out deflocculation by adding a mechanical force as a prior dispersion since the aggregating force of the fibrous conductive substance is strong. The dispersion method is not particularly limited, and a high-speed homogenizer or the like can be used.

The subsequent dispersion treatment is not particularly limited, and a disperser, such as an ultrasonic homogenizer, a beads mill, an ultrahigh-pressure grinder or the like, can be used.

Next, the yttrium oxide slurry and the fibrous conductive substance slurry are mixed so that the fibrous conductive substance becomes 0.1 volume % to 3 volume %, and preferably 0.5 volume % to 2 volume % with respect to yttrium oxide, thereby producing a mixed slurry.

The mixing method is not particularly limited, and, for example, a method in which a dual rotary blade homogenizer and a wet ball mill are combined can be used.

Next, the mixed slurry is granulated using a spray-drying method, and granulated powder composed of mixed particles of yttrium oxide particles and the fibrous conductive substance is obtained.

Here, the mixed slurry is spray-dried in a heated air stream so that the mixed particles including the yttrium oxide particles and the fibrous conductive substance can be rapidly dried and granulated while holding the respective dispersibility of the yttrium oxide particles and the fibrous conductive substance in the mixed slurry.

During spray-drying, the spraying and drying conditions of the mixed slurry are appropriately adjusted so that large granulated powder is obtained and favorable characteristics can be obtained in a sintering process in the latter step.

For example, the spray-drying conditions of the mixed slurry are adjusted so that the average granulated powder diameter becomes as large as 30 μm to 100 μm.

Next, the granulated powder is molded using a mold so as to produce a compact having a desired shape, and the compact is sintered in an inert atmosphere. Meanwhile, in a case in which the organic solvent and the like are included in the compact, the granulated powder is heated preferably to remove dispersant at a temperature below the sintering temperature, and then sintered.

The atmosphere during sintering is preferably an inert atmosphere, such as nitrogen ($N_2$) or argon (Ar), since it is necessary to prevent oxidation of the fibrous conductive substance.

In addition, the sintering temperature is preferably 1600° C. to 1850° C.

Here, the reason why the firing temperature is preferably 1600° C. to 1850° C. is that, when the firing temperature is lower than 1600° C., the fibrous conductive substance inhibits sintering of yttrium oxide, and it is not possible to obtain a dense sintered body, on the other hand, when the sintering temperature is over 1850° C., the yttrium oxide and the fibrous conductive substance directly react with each other so as to form a carbide.

In addition, the sintering time needs to be sufficient for obtaining a dense sintered body, and is, for example, 1 hour to 6 hours.

Thereby, it is possible to obtain the conductive ceramic 2 which can develop a conductivity of 10 Ω·cm or less without cutting the conductive paths formed of the fibrous conductive substance.

In addition, the insulating ceramic 3 can be manufactured by using the above yttrium oxide slurry instead of the mixed slurry in which the yttrium oxide slurry and the fibrous conductive substance slurry are mixed, similarly to the mixed slurry, spray-drying the yttrium oxide slurry so as to granulate the yttrium oxide slurry, molding the obtained granulated powder using a mold so as to produce a compact having a desired shape, and sintering the compact in an inert atmosphere.

The processes after spray-drying are totally the same as in the method of manufacturing the conductive ceramic 2.

A shape process is carried out as necessary on the conductive ceramic 2 and the insulating ceramic 3 obtained in the above manner, and the above inorganic-based adhesive material is coated on the adhering surface of at least one of the conductive ceramic 2 and the insulating ceramic 3.

Here, the types and amounts of inorganic materials included in the inorganic-based adhesive material are adjusted so that the thermal expansion coefficients of the conductive ceramic 2 and the insulating ceramic 3 and the thermal expansion coefficient of the adhesive layer 4 substantially match.

Next, the conductive ceramic 2 and the insulating ceramic 3 are temporarily adhered using the inorganic-based adhesive material, and the inorganic-based adhesive material is heated so as to be cured in a state in which the conductive ceramic and the insulating ceramic are temporarily adhered, thereby producing the adhesive layer 4.

Thereby, the ceramic member 1 integrated by adhering the conductive ceramic 2 and the insulating ceramic 3 using the adhesive layer 4 is obtained.

As described above, according to the ceramic member 1 of the embodiment, since the conductive ceramic 2 including yttrium oxide as a main component and containing 0.1 volume % to 3 volume % of the fibrous conductive substance and the insulating ceramic 3 including yttrium oxide as a main component are adhered and integrated using the adhesive layer 4 having a substantially matching thermal expansion coefficient, it is possible to make the difference between the thermal expansion coefficient of the insulating ceramic 3 and the thermal expansion coefficient of the conductive ceramic 2 extremely small, it is possible to eliminate the mismatch between the insulating ceramic 3 and the conductive ceramic 2 due to the thermal expansion difference, and there is no concern that a disadvantage, such as breakage, cracking, detachment or destruction, may be caused.

Thereby, it is possible to provide the ceramic member 1 which is excellent in terms of corrosion resistance with respect to plasma and corrosive halogen gas and in which there is no concern that a disadvantage, such as breakage, cracking, detachment or destruction, may be caused.

Second Embodiment

Figure 2:
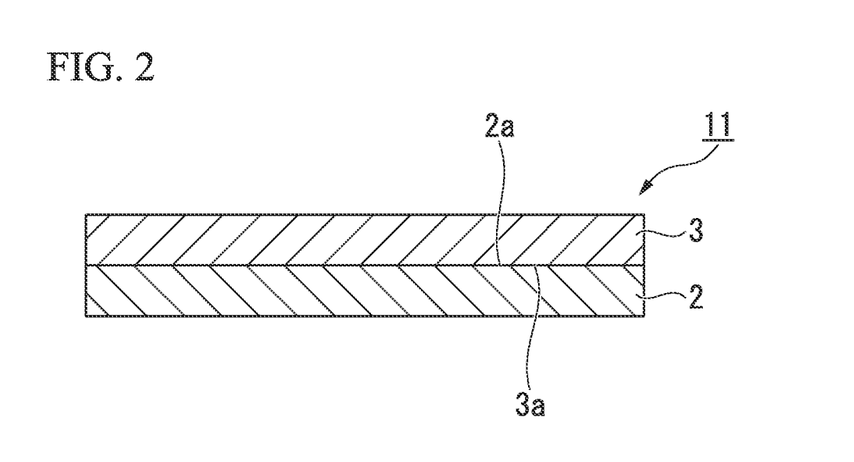
FIG. 2 is a cross-sectional view showing a ceramic member according to a second embodiment of the invention.

FIG. 2 is a cross-sectional view showing a ceramic member according to a second embodiment of the invention, and the difference of a ceramic member 11 of the present embodiment from the ceramic member 1 of the first embodiment is that, while the conductive ceramic 2 and the insulating ceramic 3 are adhered using the adhesive layer 4 having a substantially matching thermal expansion coefficient in the ceramic member 1 of the first embodiment, in the ceramic member 11 of the embodiment, the conductive ceramic 2 and the insulating ceramic 3 are joined through heating so that surfaces (main surfaces) 2a and 3a thereof are joined so as to integrate the ceramics.

The ceramic member 11 can be obtained by attaching the conductive ceramic 2 and the insulating ceramic 3 using a paste having a substantially matching thermal expansion coefficient to those of the conductive ceramic 2 and the insulating ceramic 3, and then heating the ceramics in an inert atmosphere, such as nitrogen ($N_2$) or argon (Ar), at a temperature in a range of 1000° C. to 1600° C.

In addition, the ceramic member can be also obtained by overlapping a conductive compact which is a precursor of the conductive ceramic 2 and an insulating compact which is a precursor of the insulating ceramic 3, and sintering the precursors under pressurization using a hot press or the like.

Even in the ceramic member 11 of the embodiment, the same actions and effects as in the ceramic member 1 of the first embodiment can be exhibited.

Furthermore, since the conductive ceramic 2 and the insulating ceramic 3 are joined through heating, it is possible to improve the joining strength in the interface between the insulating ceramic 3 and the conductive ceramic 2, and there is no concern that a disadvantage, such as breakage, cracking, detachment or destruction, may be caused.

EXAMPLES

Hereinafter, the invention will be described more specifically using examples and comparative examples, but the invention is not limited to the following examples.

Example 1

A. Manufacturing of the Conductive Ceramic

A carbon nanotube having a diameter of 10 nm and a length of 1.5 μm was added to pure water so that the content rate (solid content) of the carbon nanotube became 1 mass %, a dispersant is added, and then a deflocculation pretreatment was carried out using a dual rotary blade homogenizer. Next, a dispersion treatment was carried out for 9 hours using an ultrasonic homogenizer, thereby manufacturing a carbon nanotube slurry.

In addition, yttrium oxide powder having an average particle diameter of 1 μm was added to pure water so that the content rate (solid content) of the yttrium oxide powder became 40 mass %, a dispersant was added, the mixture was stirred using a stirrer, and then a yttrium oxide slurry was prepared.

Next, the carbon nanotube slurry and the yttrium oxide slurry were prepared and mixed so that the content rate of the carbon nanotube in the solid content became 1 volume %, and were stirred using a stirrer, thereby preparing a mixed slurry.

Next, the mixed slurry was dried and granulated using a spray-drying method, thereby manufacturing granulated powder including the carbon nanotube and the yttrium oxide. Next, the obtained granulated powder was molded using a mold, thereby producing a disk-like compact having a diameter of 50 mm and a thickness of 15 mm.

Next, this compact was sintered in an argon atmosphere at 1850° C. and a pressure of 20 MPa for 2 hours, thereby manufacturing a conductive ceramic of Example 1.

B. Manufacturing of the Insulating Ceramic

The yttrium oxide slurry was dried and granulated using a spray-drying method, thereby manufacturing granulated powder made of yttrium oxide. Next, the obtained granulated powder was molded using a mold, thereby producing a disk-like compact having a diameter of 50 mm and a thickness of 15 mm.

Next, this compact was sintered in an argon atmosphere at 1850° C. and a pressure of 20 MPa for 2 hours, thereby manufacturing an insulating ceramic of Example 1.

C. Manufacturing of the Ceramic Member

The conductive ceramic and the insulating ceramic were adhered using an inorganic-based adhesive material having a thermal expansion coefficient adjusted to $8 \times 10^{-6}/°$ C., and then were sintered in an argon atmosphere at 250° C. for 3 hours, thereby manufacturing a ceramic member of Example 1.

D. Evaluation of the Ceramic Member

The ceramic member was heated up to 1000° C. in a nitrogen atmosphere at a temperature-increase rate of 10° C./minute, held at 1000° C. for 1 hour, and then cooled to room temperature (25° C.) at a cooling rate of 10° C./minute. After that, the ceramic member was removed, and the occurrence of cracking and the presence of detachment due to pulling with hands were visually evaluated.

As a result, it was found that there were no occurrence of cracking and detachment due to pulling with hands, and the ceramic member had excellent durability at a high temperature.

Example 2

A ceramic member of Example 2 was manufactured according to Example 1 except that the mixed slurry was prepared so that the content rate of the carbon nanotube in the solid content became 0.5 volume %.

Next, the ceramic member of Example 2 was evaluated according to Example 1.

As a result, it was found that there were no occurrence of cracking and detachment due to pulling with hands, and the ceramic member had excellent durability at a high temperature.

Example 3

A ceramic member of Example 3 was manufactured according to Example 1 except that the mixed slurry was prepared so that the content rate of the carbon nanotube in the solid content became 3 volume %.

Next, the ceramic member of Example 3 was evaluated according to Example 1.

As a result, it was found that there were no occurrence of cracking and detachment due to pulling with hands, and the ceramic member had excellent durability at a high temperature.

Example 4

A ceramic member of Example 4 was manufactured by attaching a conductive ceramic and an insulating ceramic, which were obtained according to Example 1, using a paste having a thermal expansion coefficient adjusted to $8 \times 10^{-6}/°$ C., and then a heating treatment was carried out in a nitrogen atmosphere at 1400° C. for 1 hours.

Next, the ceramic member of Example 4 was evaluated according to Example 1.

As a result, it was found that there were no occurrence of cracking and detachment due to pulling with hands, and the ceramic member had excellent durability at a high temperature.

Comparative Example 1

A ceramic member of Comparative example 1 was manufactured according to Example 1 except that the conductive ceramic in Example 1 was changed to a silicon carbide (SiC) ceramic.

Next, the ceramic member of Comparative example 1 was evaluated according to Example 1.

As a result, it was found that cracking occurred in the ceramic, in addition, detachment of the adhesive layer was observed, and the thermal resistance was inferior to those of the ceramic members of Examples 1 to 4.

Comparative Example 2

A ceramic member of Comparative example 2 was manufactured according to Example 1 except that the conductive ceramic in Example 1 was changed to an yttrium oxide ceramic to which 10 volume % of silicon carbide (SiC) was added.

Next, the ceramic member of Comparative example 2 was evaluated according to Example 1.

As a result, it was observed that a number of cracks occurred in the adhesive layer, and it was found that the thermal resistance was inferior to those of the ceramic members of Examples 1 to 4.

Comparative Example 3

A ceramic member of Comparative example 3 was manufactured by opening bolt-joining holes in an yttrium oxide ceramic to which 10 volume % of silicon carbide (SiC) was added and the insulating ceramic of Example 1, and fastening the ceramics using bolts and nuts.

Next, the ceramic member of Comparative example 3 was evaluated according to Example 1.

As a result, it was observed that cracking occurred around the holes, and it was found that the bonding force at a high temperature was inferior to those of the ceramic members of Examples 1 to 4.

Comparative Example 4

A ceramic member of Comparative example 4 was manufactured according to Example 1 except that the content rate of the carbon nanotube in the solid content was set to 5 volume %.

Next, the ceramic member of Comparative example 4 was evaluated according to Example 1.

As a result, it was observed that a number of cracks occurred in the adhesive layer, and it was found that the thermal resistance was inferior to those of the ceramic members of Examples 1 to 4.

Comparative Example 5

A ceramic member of Comparative example 5 was manufactured by adhering the conductive ceramic and the insulating ceramic, which were obtained according to Example 1, using an epoxy adhesive.

Next, the ceramic member of Comparative example 5 was evaluated according to Example 1.

As a result, it was observed that the adhesive layer was changed, and it was found that the thermal resistance was inferior to those of the ceramic members of Examples 1 to 4.

Comparative Example 6

A ceramic member of Comparative example 6 was manufactured according to Example 1 except that the inorganic-based adhesive material of Example 1 was changed to an inorganic-based adhesive material a thermal expansion coefficient adjusted to $13 \times 10^{-6}/°$ C.

Next, the ceramic member of Comparative example 6 was evaluated according to Example 1.

As a result, it was observed that a number of cracks occurred in the adhesive layer, and it was found that the thermal resistance was inferior to those of the ceramic members of Examples 1 to 4.

INDUSTRIAL APPLICABILITY

Since the invention is a ceramic member in which, when a conductive ceramic including yttrium oxide as a main component and containing 0.1 volume % to 3 volume % of a fibrous conductive substance and an insulating ceramic including yttrium oxide as a main component are adhered using an adhesive layer made of an inorganic-based adhesive material or joined through heating, it is possible to make the difference between the thermal expansion coefficient of the insulating ceramic and the thermal expansion coefficient of the conductive ceramic extremely small, and it is possible to eliminate the mismatch caused by the difference in thermal expansion between the insulating ceramic and the conductive ceramic, the invention can be applied not only to semiconductor-manufacturing apparatuses, such as an etching apparatus using plasma, a CVD apparatus and an ashing apparatus, but also to fields other than the semiconductor-manufacturing apparatuses, such as members for flat panel display-manufacturing apparatuses and members for solar cell-manufacturing apparatuses.

REFERENCE SIGNS LIST

1 CERAMIC MEMBER
2 CONDUCTIVE CERAMIC
2a SURFACE
3 INSULATING CERAMIC
3a SURFACE
4 ADHESIVE LAYER
11 CERAMIC MEMBER

We claim:
1. A ceramic member comprising:
a conductive ceramic consisting essentially of yttrium oxide and a fibrous conductive substance, wherein the conductive ceramic includes the yttrium oxide as a main component and includes the fibrous conductive substance in an amount of 0.1 vol % to 3 vol % with respect to the yttrium oxide; and
an insulating ceramic consisting essentially of yttrium oxide;
wherein the conductive ceramic and the insulating ceramic are adhered or joined through an adhesive layer made of an inorganic adhesive material selected from alkali metal silicate-based adhesive materials, silica sol-based adhesive materials, and metal alkoxide-based adhesive materials, the conductive ceramic has a volume resistivity value ranging 0.5 Ω·cm to 10 Ω·cm, and thermal expansion coefficients of the conductive ceramic and the insulating ceramic and a thermal expansion coefficient of the adhesive layer match in a range of ±10%.

2. The ceramic member according to claim 1, wherein the fibrous conductive substance is a nanofiber having an aspect ratio of 10 or more.

3. The ceramic member according to claim 2, wherein the nanofiber is a carbon nanotube.

4. The ceramic member according to claim 1, wherein the conductive ceramic and the insulating ceramic are joined through heating.

5. The ceramic member according to claim 1, wherein the yttrium has an average particle diameter of 0.1 µm to 10 µm.

6. The ceramic member according to claim 1, wherein the fibrous conductive substance is three-dimensionally dispersed.

7. The ceramic member according to claim 1, wherein the fibrous conductive substance is one or more carbon nanotube selected from the group consisting of a Single Walled Carbon Nanotube (SWCNT), a Double Walled Carbon Nanotube (DWCNT) and a Multi Walled Carbon Nanotube (MWCNT) having an aspect ratio (length/diameter) of 10 or more, a diameter of 30 nm or less, and a length of 10 µm or less.

8. The ceramic member according to claim 1, wherein the fibrous conductive substance is present as a single body or an aggregate in which a plurality of single bodies of the fibrous conductive substance is aggregated in the matrix made of yttrium oxide particles, and the aggregation diameter of the aggregate (the diameter of the aggregate) is 5 µm or less.

9. The ceramic member according to claim 1, wherein the fibrous conductive substance has a content rate ranging from 0.5 volume % to 2 volume %.

10. The ceramic member according to claim 1, wherein the volume intrinsic resistance value of the insulating ceramic is $10^8$ Ω·cm or more.

11. A ceramic member comprising:

a conductive ceramic consisting essentially of yttrium oxide and a fibrous conductive substance, wherein the conductive ceramic includes the yttrium oxide as a main component and includes the fibrous conductive substance in an amount of 0.1 vol % to 3 vol % with respect to the yttrium oxide; and an insulating ceramic consisting essentially of yttrium oxide;

wherein the conductive ceramic and the insulating ceramic are adhered or joined through an adhesive layer made of an inorganic adhesive material selected from alkali metal silicate-based adhesive materials, silica sol-based adhesive materials, and metal alkoxide-based adhesive materials, the fibrous conductive substance is a carbon nanotube having aspect ratio of 10 or more, the conductive ceramics has a relative density of 95% or more and a volume resistivity ranging from 0.5 Ω·cm to 10 Ω·cm, the yttrium oxide contained in the conductive ceramics is yttrium oxide particle having an average particle diameter ranging from 0.1 µm to 10 µm, and the fibrous conductive substance is present in the conductive ceramics as a single body or an aggregate having a diameter of 5 µm or less.

12. The ceramic member according to claim 11, wherein the conductive ceramics is a conductive ceramics produced by a method comprising the steps of:

preparing yttrium oxide slurry containing water and yttrium oxide particles in an amount ranging from 30 mass % to 50 mass %, and fibrous conductive substance slurry containing water and fibrous conductive substance having an average secondary particle diameter of 2 µm or less in the slurry in an amount ranging from 0.5 mass % to 2 mass %, mixing the yttrium oxide slurry with the fibrous conductive substance slurry so that the fibrous conductive substance becomes 0.1 volume % to 3 volume % with respect to yttrium oxide to obtain a mixed slurry, spray-drying the resultant mixed slurry to obtain a granulated powder having average granulated powder diameter ranging from 30 µm to 100 µm, molding the resultant granulated powder using a mold to produce a compact, and sintering the resultant compact in an inert atmosphere at a temperature of 1600° C. to 1850° C. for 1 to 6 hours;

wherein the insulating ceramics is an insulating ceramics produced by a method comprising the steps of:

preparing yttrium oxide slurry containing water and yttrium oxide particles in an amount ranging from 30 mass % to 50 mass %, spray-drying the resultant slurry to obtain a granulated powder having average granulated powder diameter ranging from 30 µm to 100 µm, molding the resultant granulated powder using a mold to produce a compact, and sintering the resultant compact in an inert atmosphere at a temperature of 1600° C. to 1850° C. for 1 to 6 hours.

13. The ceramic member according to claim 11, wherein the volume intrinsic resistance value of the insulating ceramic is $10^8$ Ω·cm or more.

* * * * *